United States Patent [19]

Metz

[11] Patent Number: 4,659,945

[45] Date of Patent: Apr. 21, 1987

[54] SAMPLING BRIDGE

[75] Inventor: Arthur J. Metz, Gervais, Oreg.

[73] Assignee: Tektronix, Inc., Beaverton, Oreg.

[21] Appl. No.: 718,625

[22] Filed: Apr. 1, 1985

[51] Int. Cl.⁴ .................... H03K 17/16; H03K 17/74; G11C 27/02

[52] U.S. Cl. ................................. 307/353; 307/257; 328/151

[58] Field of Search .............. 307/352, 353, 542, 572, 307/257, 321; 328/208, 151

[56] References Cited

U.S. PATENT DOCUMENTS 3,596,191  7/1971  Stuckert .............................. 307/353
3,710,141  1/1973  Zeiger ................................. 307/353
4,518,921  5/1985  Logan ................................. 307/353

Primary Examiner—John Zazworsky
Attorney, Agent, or Firm—John P. Dellett

[57] ABSTRACT

A high frequency sample and hold circuit has a sampling diode bridge for coupling an input test signal to be sampled to a holding capacitor when all of the diodes of the bridge are forward biased by an applied strobe signal, thereby charging the capacitor to the input voltage. The diode bridge substantially uncouples the input signal from the holding capacitor when the strobe current direction is reversed such that the holding capacitor retains the charge stored thereon and therefore remains charged to the current sample signal voltage at the instant the strobe current reverses direction. Any holding capacitor charging current generated by the sampling bridge as it returns to equilibrium after strobe current reversal is offset by a holding capacitor charging current of substantially equal magnitude and opposite phase generated by a compensating bridge. The compensating bridge has capacitive coupling characteristics substantially matching those of the sampling bridge and produces the reverse phase charging current either as a result of an applied input signal being of reverse phase to the sampling bridge input signal or as a result of an applied strobe current being of reverse phase to the sampling bridge strobe signal.

13 Claims, 9 Drawing Figures

SAMPLING BRIDGE

BACKGROUND OF THE INVENTION

The present invention relates in general to waveform sampling circuits and in particular to a bridge-type sample and hold circuit for high frequency operation.

Sample and hold circuits typically charge a capacitor to the current magnitude of a sampled voltage waveform signal during a sampling interval and then disconnect the capacitor from the signal during a holding interval. The voltage stored on the capacitor is then typically converted by an analog-to digital converter to a corresponding digital value which may be stored by a memory device such as a random access memory. A set of such stored digital values obtained at various points during a sampled waveform cycle comprises a digital approximation of the analog waveform and has many uses.

One commonly used sample and hold circuit is the sampling bridge circuit of FIG. 1. The circuit includes a Schottky diode bridge comprising two diodes CR1 and CR2 having anodes connected to node A, and two other diodes CR3 and CR4 having cathodes connected to node B. The cathode of diode CR1 is connected to the anode of diode CR3 at node C and the cathode of diode CR2 is connected to the anode of diode CR4 at node D. A voltage waveform to be sampled, Vi, is applied as an input to the diode bridge at node C while the sampled output voltage Vo appears at node D. The output voltage Vo charges holding capacitor Chold. A first strobe current source IS1 is applied to node A while a second strobe current source IS2 is applied to node B. A clamping diode D1 connects node A to ground with the cathode of diode D1 being applied to node A, while another clamping diode D2 connects node B to ground with the cathode of diode D2 being grounded.

During a holding interval, when the input waveform Vi is not being sampled, the strobe current sources IS1 and IS2 are directed such that diodes CR1–CR4 are reverse biased, thereby disassociating Vo from Vi. Diodes D1 and D2 are both forward biased and clamp the strobe signal voltages VS1 and VS2 at nodes A and B to one diode forward bias voltage drop below and above ground respectively. To initiate a sampling interval, the directions of IS1 and IS2 are reversed such that diodes CR1–CR4 are forward biased, coupling Vo to Vi and allowing Chold to charge to the current magnitude of Vi. When strobe currents IS1 and IS2 are reversed once again, the reverse biased bridge diodes CR1–CR4 uncouple Vo from Vi such that the value Vi at the moment of strobe reversal remains on Chold.

Diodes CR1–CR4 all have inherent parallel capacitance. When the output signal Vo at node D is not centered between the voltages VS1 and VS2 at nodes A and B (i.e. when Vi is not at ground) at the moment a holding interval begins, the strobe reversal pumps unequal amounts of charging current through diodes CR2 and CR4. Charge is removed or added to Chold to make up the difference, causing the sampled voltage on Chold to decrease or increase just after the sampling strobe ends and introducing an error into the sampled voltage. Because the diode capacitance as a function of voltage is non-linear, this "strobe feedthrough" error is nonlinear with respect to the deviation of magniture of Vi at the moment of sampling from ground. As this strobe feedthrough effect is inversely proportional to Chold, it precludes reducing Chold to increase bandwidth or to shorten acquisition time, thus limiting the strobing frequency. FIG. 2 is a signal diagram depicting the behavior of Vi, VS1, VS2 and Vo of FIG. 1 during sample and hold intervals and illustrates the strobe feedthrough error in Vo.

The inherent capacitances of CR1–CR4 also allow some coupling of Vi to Vo during a holding interval, causing changes in the voltage held by Chold as Vi deviates from the last sampled value. This "blowby" error is more pronounced as the Vi signal frequency increases. Thus the input signal Vi bandwidth of the circuit of FIG. 1 and the strobe signal switching frequency are limited by the capacitance associated with the bridge diodes.

A prior art improvement to the bridge sample and hold circuit is shown in FIG. 3. In this circuit, strobe feedthrough is reduced by coupling clamping diodes D1 and D2 to Vo through a buffer B1. Circuit output Vout is taken at the output of buffer B1. This arrangement ensures that Vo is centered between VS1 and VS2 at the moment of strobe reversal so that no change in the charge on Chold is necessary to balance current flow in D1 and D2 immediately after strobe reversal. However, while the circuit of FIG. 3 reduces strobe feedthrough in comparison to the circuit of FIG. 1, it increases blowby error since the inherent capacitances associated with D1 and D2 in FIG. 2 now increase the coupling of Vi to Vout during a holding interval. Also, delay in buffer B1 causes this feedthrough compensation to be imperfect, with error increasing as input frequency increases.

What is needed and would be useful is a sample and hold circuit wherein strobe feedthrough is minimized without increasing signal blowby.

SUMMARY OF THE INVENTION

According to one aspect of the present invention, a sampling diode bridge couples a voltage waveform signal to be sampled to a holding capacitor when all of the diodes of the bridge are forward biased by a strobe signal, thereby allowing the holding capacitor to charge to the current magnitude of the input signal. When the strobe signals are reversed, the diodes of the bridge are reverse biased, uncoupling the input signal from the capacitor such that the holding capacitor retains the charge it received at the moment that the strobe signal is reversed. Any net charge flow to or from the charging capacitor required to return the sampling bridge to equilibrium following strobe signal reversal is matched by a net charge flow of equal magnitude and opposite phase relation produced by a compensation bridge. Thus the holding capacitor charge during a holding interval remains essentially unchanged and sample voltage error due to sampling bridge strobe feedthrough is substantially reduced or elimated.

According to another aspect of the invention, in a preferred embodiment thereof, the sampling and compensation bridges are substantially similar. The reverse phase charging current is generated by applying a reverse phase of the sampling bridge input signal to the input of the compensating bridge and applying a strobe current to the compensating bridge in phase with the strobe current applied to the sampling bridge. During a holding interval, signal blowby generated by the sampling bridge is absorbed by compensating bridge signal blowby of equal magnitude but opposite phase relation.

Thus the effect of signal blowby on the holding capacitor charge is minimized.

According to a further aspect of the invention, in an alternative embodiment thereof, the reverse phase charging current is generated by applying to the compensating bridge an input signal which is in phase with the test signal, while applying a strobe current to the compensating bridge in inverse relation to the sampling bridge strobe current. The alternative embodiment of the present invention reduces strobe feedthrough without increasing or decreasing signal blowby error. Therefore use of the preferred embodiment which also reduces signal blowby error is preferable to the alternative embodiment whenever the reverse phase of the sampled signal is available.

It is accordingly an object of the invention to provide a new and improved sample and hold circuit wherein strobe feedthrough is minimized without increasing signal blowby.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is a schematic diagram of a typical sampling bridge of the prior art,

FIG. 2 is a signal diagram showing the voltage behavior or various points of the sampling bridge of FIG. 1, FIG. 3 is a schematic diagram of another sampling bridge of the prior art, FIG. 4 is a combined schematic and block diagram of a sampling bridge according to the present invention, FIG. 5 is a schematic diagram of a sampling bridge according to the preferred embodiment of the present invention, FIG. 6 is a schematic diagram of an improvement over the sampling bridge of FIG. 5, FIG. 7 is a schematic diagram of a sample bridge according to an alternative embodiment of the present invention, and FIG. 8A and FIG. 8B are schematic diagrams depicting alternative detailed embodiments of a voltage source of FIGS. 5 or 6.

DETAILED DESCRIPTION

Figure 1:
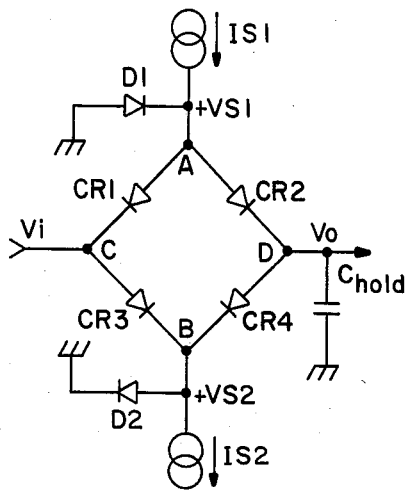
Figure 3:
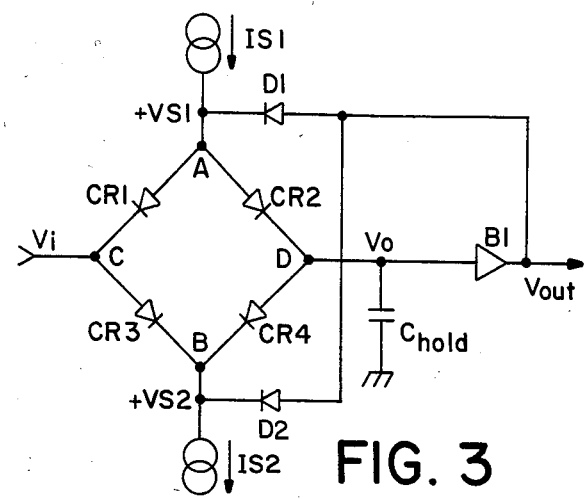
Figure 4:
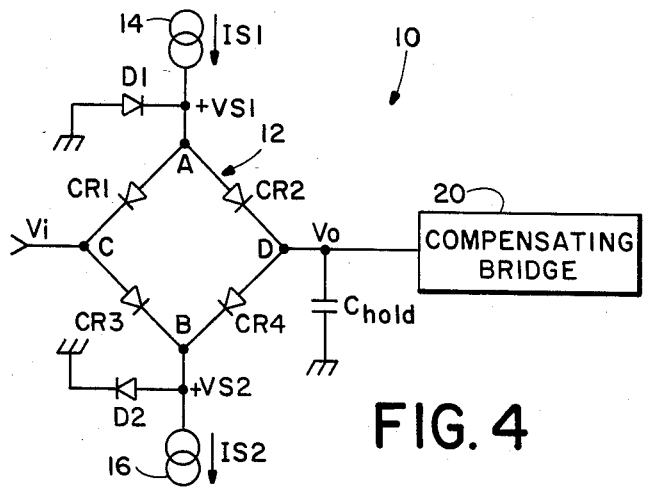
Figure 2:
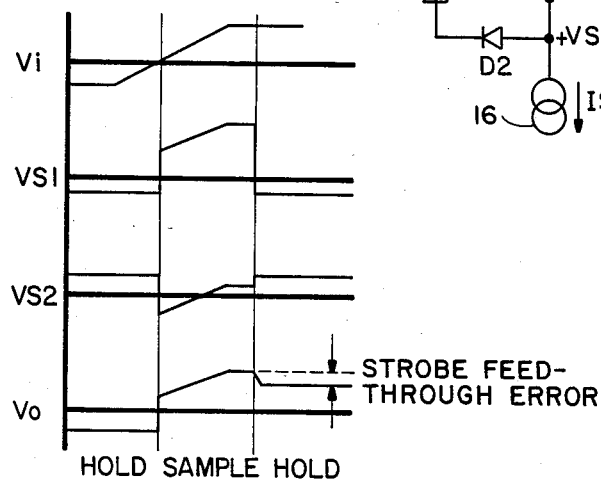

Referring to FIG. 4, a sample and hold circuit 10, depicted in schematic diagram form, is adapted to charge a holding capacitor Chold to the current voltage magnitude of an applied sampled voltage signal Vi when Schottky diodes CR1–CR4 of sampling bridge 12 are forward biased by applied strobe currents IS1 and IS2 during a sampling interval. When strobe currents IS1 and IS2 are reversed, diodes CR1–CR4 are reverse biased, substantially uncoupling the test voltage signal Vi from the holding capacitor Chold thereby initiating a holding interval. Thus during the holding period the voltage Vo across Chold remains at the sampled magnitude of Vi at the moment IS1 and IS2 are reversed.

The anodes of diodes CR1 and CR2 are joined at node A of sampling bridge 12 while the cathodes of diodes CR3 and CR4 are joined at node B. The cathode of diode CR1 is connected to the anode of diode CR3 at node C while the cthode of diode CR2 is connected to the anode of diode CR4 at node D. Current source 14 supplies strobe current IS1 into node A to forward bias diodes CR1–CR4 during a sampling interval and draws current from node A to reverse bias diodes CR1–CR4 during a holding interval. Current source 16 draws strobe current IS2 from node B during a sampling interval and supplies current to node B during a holding interval. The maximum voltage VS2 developed at node B is limited to one diode forward bias voltage drop above ground by a clamping Schottky diode D2 having its anode connected to node B and its cathode grounded. Similarly the minimum voltage drop developed at node A is limited to one diode forward bias voltage drop below ground by clamping Schottky diode D1 having its cathode connected to node A and its anode grounded.

During a sampling interval, when diodes CR1–CR4 are forward biased, the rise of samples voltage Vi above ground is limited to two forward bias diode voltage drops by diode CR3 in series with clamped diode D2. The fall of Vi below ground is limited to two forward bias diode voltage drops by diode CR1 in series with diode D1. Therefore, sampling bridge 10 is intended for use with input voltages Vi varying not more than two diode voltage drops about ground. In other embodiments of the invention, however, diodes D1 and D2 may each be replaced by a number of diodes in series, thereby extending the permissible range of Vi.

It is assumed for purposes of illustration, that the forward bias voltage drops Vd associated with all diodes of circuit 10 are equal. During a sampling interval both diodes CR2 and CR4 are forward biased and have a voltage drop of Vd from anode to cathode. The voltage VS1 appearing at node A will be Vo+Vd and the voltage VS2 at node B will be VO−VD. If the strobe currents IS1 and IS2 are reversed to initiate a holding interval, node A voltage VS1 will fall to −Vd while node B voltage VS2 will rise to +Vd as limited by clamping diodes D1 and D2. Thus the total voltage change at node A following strobe current reversal is −Vo−2Vd while the total voltage change at node B is Vo−2 Vd.

Diodes CR2 and CR4 have inherent capacitances which lose or gain charge when the voltages at nodes A and B change. If output voltage Vo at node D happens to be at ground level (i.e. Vo=0) then the voltage rise at node A will equal the voltage fall at node B and the voltage change across diodes CR2 and CR4 will both equal 2 Vd. If the inherent capacitance of diodes CR2 and CR4 are approximately equal, the rate at which charging current passes through CR2 and CR4 will be equal and no charging current will flow in or out of bridge 12 via node D.

If however, Vin is some value other than 0 at the moment IS1 and IS2 are reversed, then the resulting voltage drops across CR2 and CR4 will be unequal and total charge supplied to CR2 thereafter will differ from the charge supplied to CR4. This difference in charge results in a net charge flow into or out of bridge 12 at node D.

In the prior art this net charge flow is supplied from the holding capacitor Chold. If Vo is initially at a voltage level higher than ground, CR2 requires more charge than supplied by CR4 and the difference is accounted for by a net charge flow out of Chold, thereby reducing output voltage Vo. If Vo is initially below ground level, then CR2 requires less charge than supplied by CR4 and the difference is diverted into Chold, increasing the charge stored by chold along with output voltage Vo. Thus when Vo is not at ground level at the end of a sampling period, the value of Vo changes in the direction of ground during the holding period and a "strobe feedthrough" error is introduced into the sample voltage Vo. The amount of this strobe feedthrough error varies nonlinearly with the initial value of Vo making it difficult for circuits using this sampled voltage to calibrate out the error.

In the present invention, a compensating bridge 20 is provided to produce a net output charging current to Chold which is of equal magnitude but of reverse phase to the net output charging current of bridge 12. The output of bridge 20 is connected to the output of bridge 12 so that any charging current flowing in or out of bridge 12 due to strobe feedthrough, tending to decrease or increase the charge on Chold, is offset by an equal and opposite strobe feedthrough charging current from bridge 20.

Figure 5:
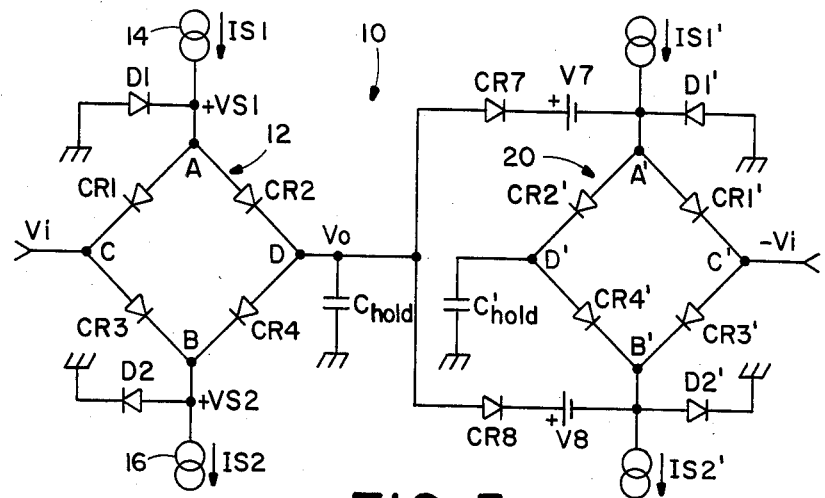

Referring to FIG. 5, a preferred embodiment of sample and hold circuit 10 includes compensating bridge 20 depicted in more detailed circuit diagram form. Compensating bridge 20 comprises Schottky diodes $CR1'$-$CR4'$, $D1'$ and $D2'$ connected to nodes $A'$-$D'$ in the same fashion that the corresponding diodes of bridge 12 are connected to nodes A-D. The diodes of bridge 20 are selected to match the forward bias voltage drop and inherent capacitance characteristics of the corresponding diodes of bridge 12. This matching is most easily arranged if bridges 12 and 20 are implemented on the same integrated circuit chip.

An input voltage $-Vi$, of equal magnitude and opposite phase to sampled voltage Vi, is applied to node $C'$ of bridge 20. Such an opposite phase voltage is typically available as an inverted output when Vi is a non-inverted output of a differential amplifier (not shown). A second holding capacitor $C'hold$ is connected between ground and node $D'$. A first strobe current $IS1'$ is applied to node $A'$ of bridge 20 while a second strobe current $IS2'$ is applied to node $B'$ of bridge 20. During sampling and holding intervals these strobe currents are of the same magnitude and phase as corresponding strobe currents IS1 and IS of sampling bridge 12. The negative side of a DC voltage source V7 is connected to node $A'$ while the positive side of source V7 is connected to the cathode of a diode CR7. The anode of diode CR7 is applied to output node D of bridge 12. Similarly, a voltage source V8 and a diode CR8 link node $B'$ of bridge 20 to node D of bridge 12. Voltage sources V7 and V8 are sized to ensure that diodes CR7 and CR8 do not conduct significantly in the forward direction at input signal Vi extremes.

During a sampling interval, the strobe currents $IS1'$ and $IS2'$ applied to compensating bridge 20 forward bias diodes $CR1'$-$CR4'$ and reverse bias diodes $D1'$ and $D2'$ in the same way strobe currents IS2 and IS2 affect the corresponding diodes of sampling bridge 12. Prior to strobe current reversal to initiate a holding period, the voltage at node $A'$ IS $-VI+Vd$ while the voltage at $B'$ is $-Vi-Vd$. After strobe reversal the voltage at node $A'$ is $-Vd$ while the voltage at node $B'$ is $+Vd$. The voltage Vo held at node D of bridge 12 by capacitor Chold immediately before and after strobe reversal is the sampled voltage Vi. Thus the change in voltage across diode CR7 as as result of strobe reversal is $Vi-2Vd$, drawing a charge flow into CR7 from node D. The same voltage change occurs across diode CR4 of sampling bridge 12 driving charge out of CR4 and into node D. If the inherent capacitances of diodes CR4 and CR7 are the same, then during a holding period the charge entering node D from CR4 nearly equals the charge leaving node D to CR7. There is slightly less charge through the compensating diodes because they need to have reverse bias (set by V7, V8 etc). This can be improved by oversizing the compensating diodes. Similarly, if the inherent capacitance of CR8 is equal to that of CR2, the voltage change across CR8 due to strobe reversal is equal to the voltage change across CR2 and is directed such that the charge drawn from node D by CR2 nearly equals the charge suppled to node D by CR8. Thus the charges flowing through node D between bridges 12 and 20 cancel one another and there is no net change to the charge on Chold as a result of strobe feedthrough.

Figure 6:
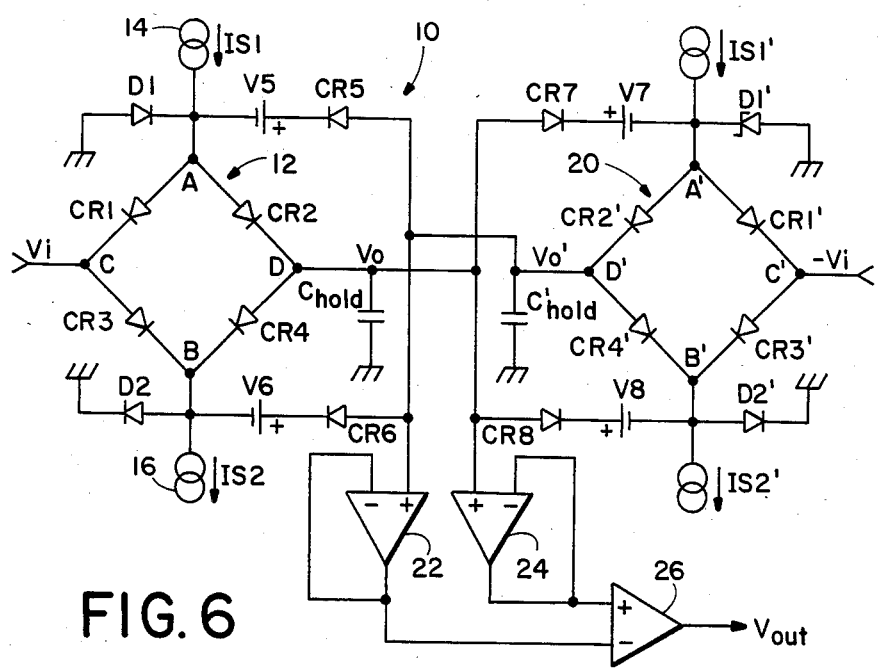

One additional advantage to the circuit of FIG. 5 is its ability to reduce signal blowby error. During a holding interval, charging currents passing through CR2 and CR4 are offset by charging currents of equal magnitude but opposite phase passing through CR7 and CR8 so that the charge on Chold is not affected by signal blowby from either bridge.

an improvement to the circuit of FIG. 5 is shown in FIG. 6. In the circuit of FIG. 6, voltage source V5 and diode CR5 couple node A of bridge 12 to node $D'$ of bridge 20 while voltage source V6 and diode CR6 couple node B of bridge 12 to node $D'$ of bridge 20. Diodes CR5 and CR6 compensate for imbalances in charging current passing through diodes $CR2'$ and $CR4'$ following strobe current reversal at the start of a holding interval in the same way that diodes CR7 and CR8 compensate for imbalances in charging current passing through CR2 and CR4 such that the charge on capacitor C'hold remains constant. The voltage output $Vo'$ at node $D'$ of compensating bridge 20 will be equal in magnitude but opposite in polarity to the output Vo at node D of bridge 12. Node $D'$ is connected to the input of a buffer 22 while node D is connected to the input of another buffer 24. The outputs of buffers 22 and 24 are applied to the inverting and non-inverting inputs of a differential amplifier 26 which generates the sampling bridge output voltage Vout.

The circuit of FIG. 6 has a number of advantages over that of FIG. 5. Use of the differential output voltages Vo and $Vo'$ to drive amplifier 26 improves the circuit output signal-to-noise ratio and common mode rejection. The differential arrangement of FIG. 6 also reduces output voltage droop due to reduction in charge on the storage capacitor resulting from finite output stage amplifier input impedance. These drops in capacitor voltage appear as a common mode signal which is rejected by differential amplifier 26.

Figures 8A, 8B:
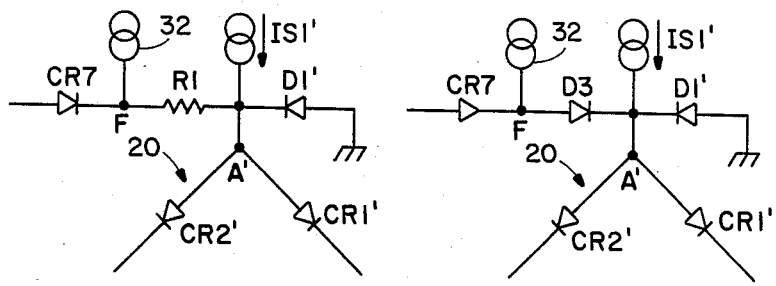

The voltage source V7 of FIGS. 5 and 6 can be simulated in a variety of ways. Two such methods are shown in FIGS. 8A and 8B, depicting alternative versions of a portion of the circuits of either FIGS. 5 or 6. In FIG. 8A, a resistor R1 links diode CR7 to node $A'$ of compensating bridge 20. A current source 32 supplies current to the node F between CR7 and node $A'$ sufficient to produce a voltage ($Vc > Vd + Vo$) at node F larger than the maximum obtainable value of Vo at node D. This ensures diode CR7 remains off during both holding and sampling intervals. In FIG. 8B, PN junction diode D3 in placed between CR7 and node $A'$. A current source 32 supplies current to node F between CR7 and D3. Diode D3 is forward biased ensuring node F is one forward voltage drop above node A. This is sufficient to ensure diode CR7 remains reverse biased. Voltage sources V5, V6 and V8 of FIGS. 5 and 6 may be simulated in a similar fashion.

Figure 7:
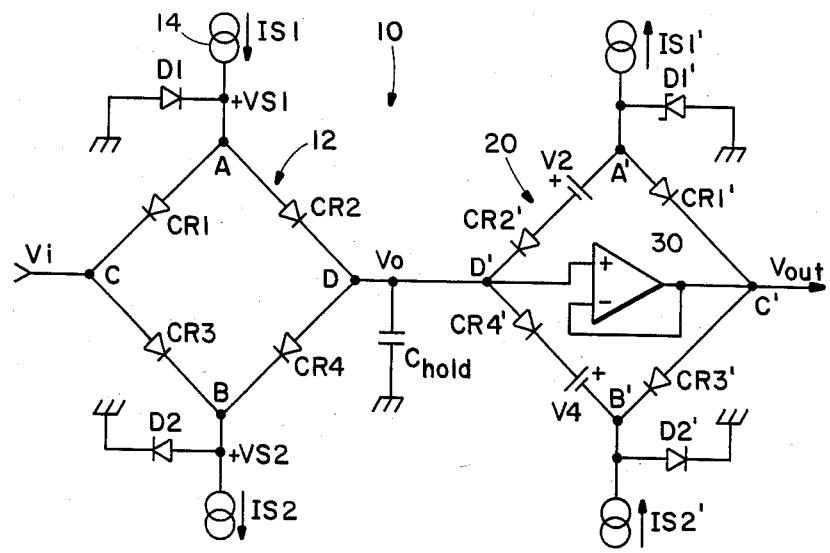

Referring to FIG. 7, an alternative embodiment of the present invention, depicted in schematic diagram form, is adapted to provide compensating charge flow to node D of sampling bridge 12 when a reverse phase of sampled signal Vi is not available as an input for a compensating bridge. In FIG. 7, compensating bridge 20 comprises diodes CR1'–CR4', D1' and D2', voltage sources V2 and V4, and buffer amplifier 30. Diode CR1' has an anode connected to node A' of bridge 20 and a cathode connected to node C'. The positive side of voltage source V2 is connected to node A' while its negative side is attached to the anode of diode CR2'. The cathode of CR2' and the anode of CR4' are joined at node D'. The positive side of voltage source V4' is connected to the cathode of CR4'. The negative side of V4' and the cathode of CR3' are joined at node B'. The anode of diode CR3' is coupled to node C'. Voltage sources V2 and V4 are sized to ensure that diodes CR2' and CR4' remain reverse biased during both sampling and holding intervals. The cathode of diode CR1' and the anode of CR3' are joined at node C'. A diode D1' couples node A' to ground such that D1 is reverse biased when the voltage at node A' is above ground. Similarly diode D2' couples node B' to ground such that D2 is reversed biased when node B' is below ground voltage. The output voltage Vo across holding capacitor Chold at node D of sampling bridge 12 is connected to node D' of compensating bridge 20. The ouput voltage Vout of sample and hold circuit 10 is taken at node C' of bridge 20. A buffering amplifier 30 links node D' to node C'. The diodes CR2' and CR4' of bridge 20 are selected to match the forward bias voltage drop and inherent capacitance characteristics of the corresponding CR2 and CR4 diodes of bridge 12.

A strobe current IS1' is applied to node A' while another strobe current IS2' is applied to node B'. Currents IS1' and IS2' are of equal magnitude but of opposite phase to corresponding strobe currents IS1 and IS2 of the sampling bridge 12. Thus when sampling bridge 12 is in a sampling interval, the diodes CR1'–CR4' of bridge 20 are all reverse biased, and when sampling bridge 12 is in a holding interval, the diodes CR1' and CR3' of compensating bridge 20' are forward biased. Buffering amplifier 30 has unit gain, so the voltage Vout appearing at node C' will be equal to Vo which, in turn, is equal to Vi during a sampling interval. At the moment of strobe current reversal, initiating a holding interval, Vout is of the same magnitude and phase as the input Vi and the output Vo of bridge 12. Since the input voltage Vout to bridge 20 at node C' is in phase with the input voltage to bridge 12 and since the strobe currents are of reverse phase to one another, any charging current passing into node D of bridge 12 following strobe current reversal is matched by a charging current of equal magnitude passing out of node D' of bridge 20. Similarly, any charging current passing out of node D' is matched by an equivalent charging current passing into node D. Since charging current supplied by one bridge is equal to that required by the other, there is no change in charge on capacitor Chold due to strobe feedthrough during a holding interval.

Thus in either the preferred or altenative embodiments of the present invention, a compensating bridge having capacitive coupling characteristics matching those of the sampling bridge produces holding capacitor charging currents which are of equal magnitude but opposite phase to charging currents generated by the sampling bridge. In the preferred embodiment, the reverse phase charging currents are produced by applying a reverse phase input signal to the compensating bridge and then applying strobe current to the compensating bridge in-phase with the sampling bridge. In the alternative embodiment, the reverse phase charging currents are generated by applying an in-phase input signal and a reverse phase strobe current to the compensating bridge. Both the preferred and alternative embodiments of the sample and hold circuit allow high frequency circuit operation without substantial strobe feedthrough error. The preferred embodiment further minimizes errors due to signal blowby.

While several embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A sample and hold circuit comprising:

a holding capacitor;

a sampling bridge comprising a plurality of diodes each having inherent parallel capacitance, said sampling bridge coupling a voltage signal to be sampled to the holding capacitor when the sampling bridge diodes are forward biased by an applied strobe current, and substantially uncoupling the voltage signal from the holding capacitor when the sampling bridge diodes are reverse biased by a strobe current direction reversal, said sampling bridge being of the type which generates a holding capacitor charging current following strobe current reversal due to imbalanced charging of said inherent parallel capacitance of said plurality of diodes; and means for generating a compensating holding capacitor charging current of opposite phase to the holding capacitor charging current generated by the sampling bridge following strobe current direction reversal.

2. A sample and hold circuit comprising:

a holding capacitor;

a sampling bridge comprising a plurality of diodes each having inherent parallel capacitance, said sampling bridge coupling a voltage signal to be sampled to the holding capacitor when the sampling bridge diodes are forward biased by an applied strobe current, and substantially uncoupling the voltage signal from the holding capacitor when the sampling bridge diodes are reverse biased by a strobe current direction reversal; and a compensating circuit, adapted to generate a compensating holding capacitor charging current of opposite phase to a holding capacitor charging current generated by the sampling bridge as a result of charging said parallel capacitance by said strobe current following strobe current direction reversal, wherein the compensating circuit has capacitance and wherein said compensating charging current is generated as a result of charging of said compensating circuit capacitance.

3. A sample and hold circuit as in claim 2 wherein said compensating circuit comprises diodes having inherent parallel capacitance.

4. A sample and hold circuit comprising:
   a holding capacitor;
   a sampling bridge comprising a plurality of diodes each having inherent parallel capacitance, said sampling bridge coupling a voltage signal to be sampled to the holding capacitor when the sampling bridge diodes are forward biased by and applied strobe current, and substantially uncoupling the voltage signal from the holding capacitor when the sampling bridge diodes are reverse biased by a strobe current direction reversal; and
   a compensating circuit, adapted to generate a compensating holding capacitor charging current of opposite phase to a holding capacitor charging current generated by the sampling bridge as a result of charging said parallel capacitance by said strobe current following strobe current direction reversal, wherein the compensating circuit holding capacitor charging current is substantially of equal magnitude to the charging current generated by the sampling bridge.

5. A sample and hold circuit comprising:
   a holding capacitor;
   a sampling bridge comprising a plurality of diodes each having inherent parallel capacitance, said sampling bridge coupling a voltage signal to be sampled to the holding capacitor when the sampling bridge diodes are forward biased by an applied strobe current, and substantially uncoupling the voltage signal from the holding capacitor when the sampling bridge diodes are reverse biased by a strobe current direction reversal; and
   a compensating circuit, adapted to generate a compensating holding capacitor charging current of opposite phase to a holding capacitor charging current generated by the sampling bridge as a result of charging said parallel capacitance by said strobe current following strobe current direction reversal, wherein the compensating circuit comprises a compensating bridge similar to the sampling bridge comprising diodes having inherent capacitance characteristics substantially similar to corresponding sampling bridge diodes, the compensating bridge having a strobe current applied in reverse phase to the sampling bridge strobe current, and having an applied input voltage signal in phase with the sample voltage.

6. A sample and hold circuit as in claim 5 wherein the sampled voltage signal and the compensating diode bridge input signal are of substantially equal magnitude at the moment of strobe current reversal.

7. A sample and hold circuit as in claim 6 wherein the sample voltage signal are of substantially equal magnitude at the moment of sample and compensating bridge strobe current reversal.

8. A sample and hold circuit comprising:
   a first holding capacitor;
   a second holding capacitor;
   a sampling bridge comprising a plurality of diodes each having inherent parallel capacitance, said sampling bridge coupling a sample voltage signal to the first holding capacitor when the sampling bridge diodes are forward biased by a first applied strobe current, and substantially uncoupling the sample voltage from the holding capacitor when the sampling bridge diodes are reverse biased by a reversal of said first strobe current;
   a compensating bridge comprising a plurality of diodes each having inherent parallel capacitance, said compensating bridge coupling an input voltage signal to the second holding capacitor when the compensating bridge diodes are forward biased by a second applied strobe current, and substantially uncoupling the second input voltage signal from the second holding capacitor when the diodes of the compensating bridge are reverse biased by a reversal of said second strobe current, said sample and input voltage signals being of substantially equal magnitude and opposite phase, said first and second strobe currents being applied and reversed at the same time;
   first means to capacitively couple a first selected node of the compensating diode bridge to the first holding capacitor; and
   second means to capacitively couple a second selected node of the compensating diode bridge to the first holding capacitor.

9. A sample and hold circuit as in claim 8 wherein the capacitances associated with the first and second means are such that a first holding capacitor charging current generated by the sampling diode bridge as a result of said sampling bridge diode inherent capacitance following strobe current reversal is substantially equal but opposite in phase to a holding capacitor charging current generated by the first and second capacitive coupling means following second strobe current reversal.

10. A sample and hold circuit as in claim 8 further comprising:
    third means to capacitively couple a first selected node of the sampling diode bridge to the second charging capacitor; and
    fourth means to capacitively couple a second selected node of the sampling diode bridge to the second charging capacitor.

11. A sample and hold circuit as in claim 10 further comprising:
    differential amplifier means having inputs coupled to the first and second holding capacitors.

12. A sample and hold circuit as in claim 11 wherein said differential amplifier inputs are coupled to said holding capacitors by buffering means.

13. A sample and hold circuit comprising:
    a holding capacitor;
    a sampling bridge comprising a plurality of diodes each having inherent parallel capacitance, said sampling bridge coupling a sample voltage signal to the holding capacitor when the sampling bridge diodes are forward biased by a first strobe current, and substantially uncoupling the sample voltage signal from the holding capacitor when the sampling bridge diodes are reverse biased by a first strobe current direction reversal; and
    a compensating bridge comprising a plurality of diodes each having inherent parallel capacitance, said compensating bridge capacitively coupling an output voltage thereof to the holding capacitor when compensating bridge diodes are forward biased by a second strobe current, and substantially uncoupling the output voltage from the holding capacitor when the compensating bridge diodes are reverse biased by a second strobe current direction reversal, said sample and output voltages being of substantially equal phase and magnitude, said first and second strobe currents being of oppostie phase relation such that a holding capacitor charging current generated by the sampling bridge as a result of said sampling bridge diode inherent capacitance following first strobe current reversal is substantially equal but opposite in phase to a holding capacitor charging current generated by the compensating bridge.

* * * * *